(12) United States Patent
Chang

(10) Patent No.: US 7,924,180 B2
(45) Date of Patent: Apr. 12, 2011

(54) HUFFMAN DECODING METHOD AND APPARATUS

(75) Inventor: Yung-Chang Chang, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/621,708

(22) Filed: Nov. 19, 2009

(65) Prior Publication Data

US 2010/0079315 A1  Apr. 1, 2010

Related U.S. Application Data

(63) Continuation of application No. 12/098,473, filed on Apr. 7, 2008, now Pat. No. 7,642,935.

(51) Int. Cl.
*H03M 7/40* (2006.01)

(52) U.S. Cl. .................. 341/67; 341/50; 341/51

(58) Field of Classification Search .......... 341/50, 341/51, 67, 63, 65; 382/232
See application file for complete search history.

(56) References Cited

U.S. PATENT DOCUMENTS

| | | | |
|---|---|---|---|
| 5,220,325 A | 6/1993 | Ackland et al. | |
| 5,689,255 A | 11/1997 | Frazier | |
| 5,883,975 A | 3/1999 | Narita | |
| 5,982,306 A | 11/1999 | Nam | |
| 6,043,765 A | 3/2000 | Twardowski | |
| 6,501,398 B2 | 12/2002 | Toyokura | |
| 6,603,413 B2 | 8/2003 | Igarashi et al. | |
| 6,657,569 B2 | 12/2003 | Barnett | |
| 7,184,597 B1* | 2/2007 | Aronov | 382/232 |
| 7,358,870 B2* | 4/2008 | Bay | 341/65 |
| 2001/0026230 A1 | 10/2001 | Toyokura | |
| 2002/0154042 A1 | 10/2002 | Igarashi et al. | |

* cited by examiner

*Primary Examiner* — Jean B Jeanglaude
(74) *Attorney, Agent, or Firm* — Thomas | Kayden

(57) ABSTRACT

A decoder for decoding an input bit stream into a plurality of symbols is provided. The decoder includes an extractor, a length generator, a base selector, and a processing unit. The extractor receives the input bit stream and extracts a code with a predetermined codeword length therefrom. The length generator receives the extracted code and determines a first codeword length corresponding to a symbol according to the extracted code and a base table. The base selector determines a codeword base corresponding to the first codeword length according to the base table. The processing unit generates the symbol corresponding to the extracted code according to the codeword base, an offset table and the first codeword length.

4 Claims, 12 Drawing Sheets

| symbol | mat | sat | vat | pat | bat | eat | fat | oat | cat | rat | hat |
|---|---|---|---|---|---|---|---|---|---|---|---|
| $r_i$ | 1 | 2 | 3 | 4 | 5 | 6 | 7 | 8 | 9 | 10 | 11 |
| $l_i$ | 5 | 5 | 4 | 4 | 4 | 4 | 4 | 3 | 3 | 3 | 2 |
| $c_i$ | 00000 | 00001 | 0001 | 0010 | 0011 | 0100 | 0101 | 011 | 100 | 101 | 11 |

FIG. 1

| $\ell$ | 2 | 3 | 4 | 5 |
|---|---|---|---|---|
| base[$\ell$] | 3 | 3 | 1 | 0 |
| offset[$\ell$] | 11 | 8 | 3 | 1 |

FIG. 2

| $\ell$ | 2 | 3 | 4 | 5 |
|---|---|---|---|---|
| $l_j\_base[\ell]$ (binary) | 11000 | 01100 | 00010 | 00000 |
| $l_j\_base[\ell]$ (decimal) | 24 | 12 | 2 | 0 |

FIG. 3

HUFFMAN DECODING METHOD AND APPARATUS

CROSS REFERENCE TO RELATED APPLICATIONS

This application is a Continuation of U.S. patent application Ser. No. 12/098,473, filed Apr. 7, 2008, the entirety of which is incorporated by reference herein.

BACKGROUND OF THE INVENTION

1. Field of the Invention

The invention relates generally to video decoders, and more particularly to methods and apparatus to speed up operations of Huffman decoders.

2. Description of the Related Art

Huffman codes are very widely used in the area of data compression. Canonical Huffman codes are of special interest as they improve the efficiency of the decoding process, make decoding easier, and have become one of the entropy coding strategies that are commonly used in multimedia applications, such as Real Video standard. However, existing Huffman decoders require substantial use of specialized independent hardware components, such as adders, subtractors and comparators, etc., to accomplish the decompression of canonical Huffman encoded data, which increases production cost and induces critical path delays, thus decreasing the decoding speed. Hence, existing Huffman decoders may encounter problems in some applications; for example, in a full high definition (full HD) resolution implementation (1920 by 1080 pixels per frame) since with the critical path delays, the decoders are unable to accommodate speed requirements of real-time processing. Thus, a need exists for an improved method and apparatus to achieve real time throughput for decoding of a HD resolution video bit stream employing canonical Huffman coding technique, such as Real Video bit stream.

BRIEF SUMMARY OF THE INVENTION

Therefore, the invention provides a lower cost apparatus and method improving real-time performance for decoding high definition (HD) video bit stream encoded in canonical Huffman code.

In one aspect, the invention is directed at a decoder for decoding an input bit stream into a plurality of symbols, wherein the input bit stream is canonical Huffman encoded bit stream. The decoder comprises an extractor, a length generator, a base selector and a processing unit. The extractor receives the input bit stream and extracts a code with a predetermined codeword length therefrom. The length generator receives the extracted code and determines a first codeword length corresponding to a symbol according to the extracted code and a base table. The base selector determines a codeword base corresponding to the first codeword length according to the base table. The processing unit generates the symbol corresponding to the extracted code according to the codeword base, an offset table, and the first codeword length.

In a further aspect of the invention, the decoder further comprises latch units for providing a pipeline process. Thus, the processing unit generates the symbol corresponding to the first codeword length when the length generator operates to generate a next first codeword length simultaneously.

In another aspect, the invention is directed at a decoding apparatus capable of decoding an input bit stream into a plurality of symbols. The decoding apparatus comprises at least two decoders connected in cascade, and each of which comprises an extractor, a length generator, a base selector and a processing unit. The extractor receives the input bit stream and extracts a code with a predetermined codeword length therefrom. The length generator receives the extracted code and determining a first codeword length corresponding to a symbol according to the extracted code and a base table. The base selector determines a codeword base corresponding to the first codeword length according to the base table. The processing unit generates the symbol corresponding to the extracted code according to the codeword base, an offset table, and the first codeword length. In this way, when the first codeword length of a head decoder is outputted to a following decoder, the extractor of the following decoder extracts the code from the input bit stream according to the first codeword length from the head decoder.

In an alternative aspect of the invention, a decoding method is provided for decoding an input bit stream into a plurality of symbols. The decoding method first provides a first-phase decoding unit in a first phase for generating a first codeword length according to a code with a predetermined codeword length extracted from the input bit stream, wherein the first codeword length is determined by comparing the extracted code with a plurality of base values from a base table. Then, a second-phase decoding unit is provided in a second phase for obtaining a symbol corresponding to the extracted code according to a codeword base from the base table and a codeword offset from an offset table corresponding to the first codeword length. The symbol corresponding to the extracted code is obtained in the second phase while a next first codeword length is obtained in the first phase simultaneously.

In another alternative aspect, the invention provides a decoding method for decoding an input bit stream into a plurality of symbols in parallel, comprising the steps of: receiving the input bit stream to generate a first code with a predetermined codeword length; generating an array having a plurality of second codes with the predetermined codeword length, wherein the second codes of the array are obtained by left shifting the input bit stream with respect to each of a plurality of shift bits, wherein the shift bits are different integers ranging from one to the predetermined codeword length; calculating a plurality of candidate codeword lengths corresponding to the plurality of second codes respectively; determining a first codeword length corresponding to a first symbol; selecting a second codeword length corresponding to a second symbol from the plurality of candidate codeword lengths according to the first codeword length; and obtaining the first and second symbols corresponding to the first and second codeword lengths respectively.

BRIEF DESCRIPTION OF THE DRAWINGS

The invention will become more fully understood from the detailed description, given herein below, and the accompanying drawings. The drawings and description are provided for purposes of illustration only, and, thus, are not intended to be limiting of the invention.

FIG. 1 is a table illustrating a sample set of symbols and their corresponding probabilities, codeword lengths and assigned canonical Huffman encoded data;

FIG. 2 is a table illustrating codeword bases and codeword offsets with respect to the codeword lengths of FIG. 1;

FIG. 3 is a table illustrating the values of $l_j\_base[l]$ with w=5 according to the sample set of symbols in FIG. 1 and FIG. 2;

DETAILED DESCRIPTION OF THE INVENTION

Figure 4:
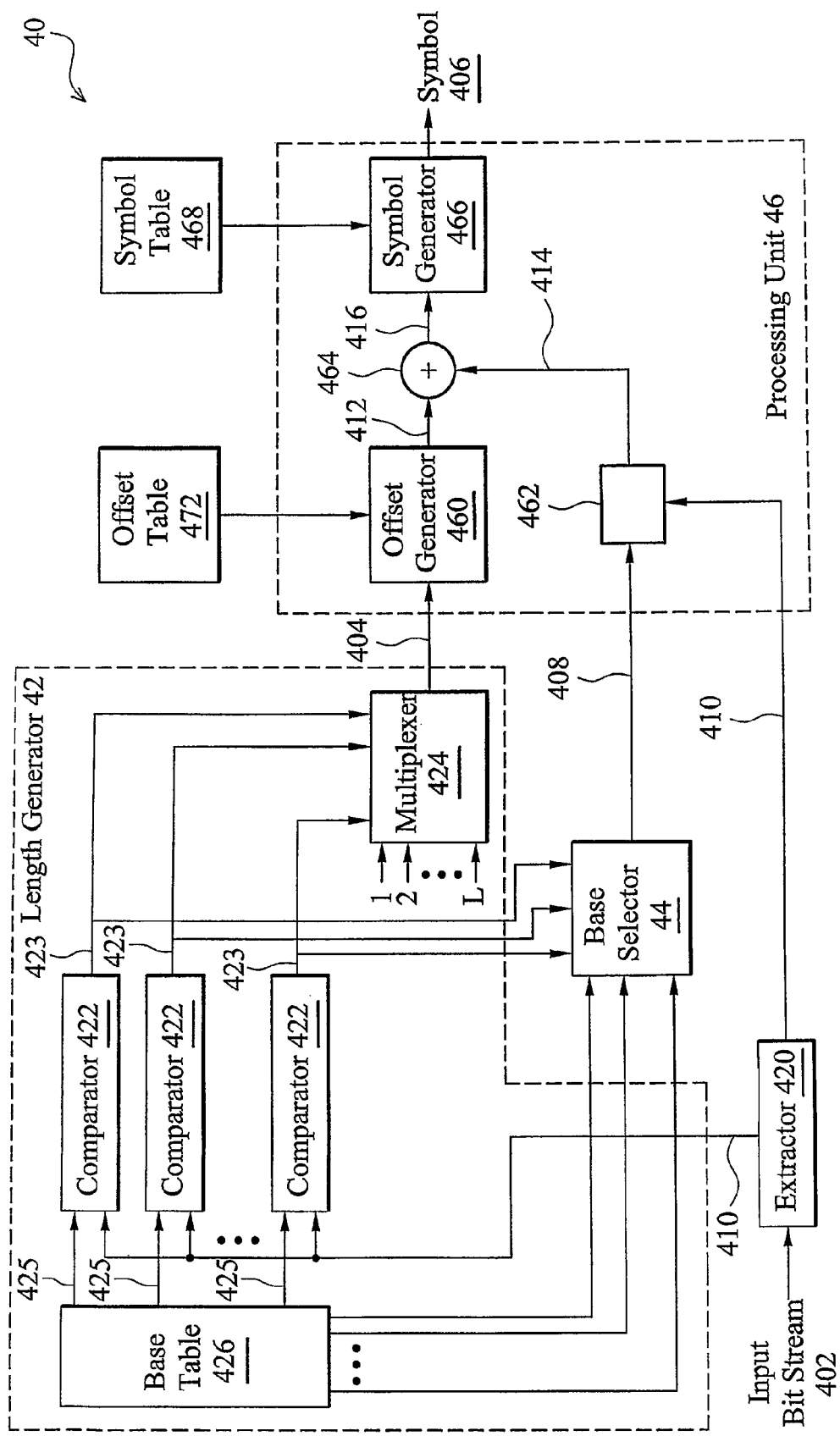
FIG. 4 is a block diagram of a decoder for decoding an input bit stream into a plurality of symbols according to one embodiment of the invention.

Generally, Huffman coding is a variable length coding method that compresses a frequently occurring symbol with shorter codes. Thus, the length of each codeword is inversely related to the probability with which each symbol appears. Additionally, canonical Huffman codes are Huffman codes that further improve the efficiency of the decoding process. One property of canonical Huffman coding is that higher codeword values with same codeword length represent a higher occurrence probability of the associated symbols. In particular, as will be described in more detail below, canonical Huffman codes can be completely decoded only with codeword lengths for each symbol.

Figure 2:
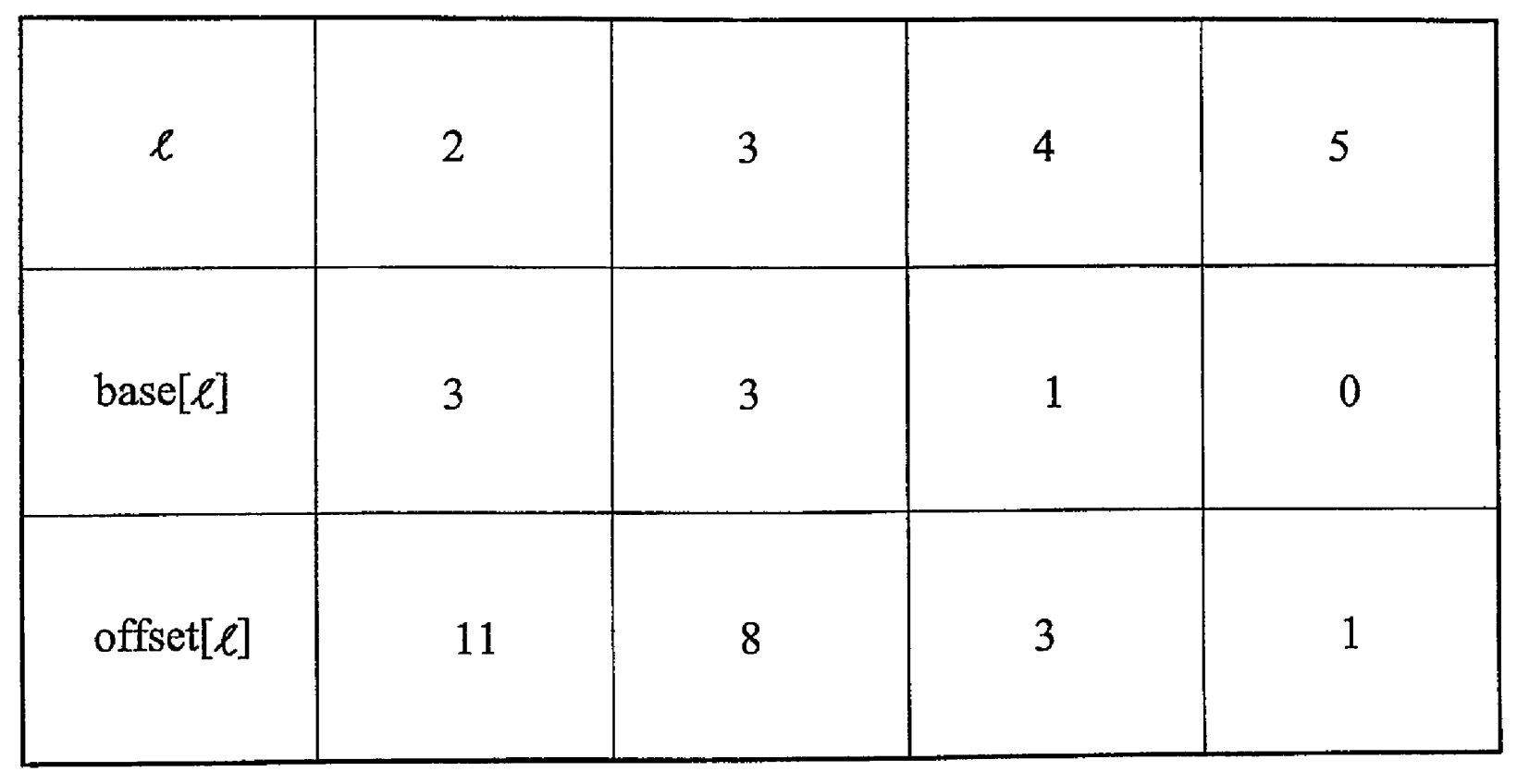

Please refer to FIG. 1 and FIG. 2. FIG. 1 is a table illustrating a sample set of symbols and their corresponding probabilities, codeword lengths and assigned canonical Huffman encoded data. FIG. 2 is a table illustrating codeword bases and codeword offsets with respect to the codeword lengths of FIG. 1. In FIG. 1, $r_i$ represents a symbol number mapping symbols to ordinal identifiers in increasing probability order, $l_i$ represents codeword lengths in bits assigned to the $i_{th}$ least frequent source symbol, and $c_i$ represents the encoded codewords of symbols. The codeword base base[l] and codeword offset offset[l] for each distinct codeword length l are shown in FIG. 2; wherein base[l] and offset[l] represent the smallest codeword value and the smallest symbol number $r_i$ of each length l respectively. With reference to tables of FIG. 1 and FIG. 2, an exemplary algorithm of generating the assigned canonical Huffman codewords is presented, but not limited to, and is implemented by following the steps described below.

Step 1a: Determine the maximum codeword length l such that offset[l]≦symbol number $r_i$.

Step 1b: Set code value=base[l]+($r_i$−offset[l]).

Step 1c: Output the codeword $c_i$ of length l corresponding to the code value.

For example, to code the symbol cat, the corresponding symbol number $r_i$ is 9 according to FIG. 1. At step 1a, the codeword length l is determined to be 3 to satisfy the equation offset[3]≦9 in accordance with the table of FIG. 2. Then, Step 1b is performed to obtain code value=base[l]+($r_i$−offset[l])= 3+(9−8)=4. Therefore, the codeword of the symbol "cat" is "100" with codeword length l=3 and code value=4.

Similarly, decoding a symbol from a canonical Huffman encoded bit stream employs the use of the codeword length. The steps of a fast decoding algorithm is presented, but not limited to, and are described below.

Step 2a: Determine the maximum codeword length l such that $l_j$_base[l]≦V, wherein V is the code value with w bits.

Step 2b: Set $r_i$=offset[l]+(V−base[l])>>(w−l).

Step 2c: Look up corresponding symbol in accordance with $r_i$ and the table of FIG. 1.

Step 2d: LeftShift the bit stream with l bits to update V, that is V=LeftShift(V, l)

In the fast decoding algorithm, a w-bit codes V extracted from the bit stream is utilized to reconstruct the source symbol, where w is some integer not smaller than the length of a longest codeword, L. For example, it is assumed that w is 5 in accordance with FIG. 1 and FIG. 2. FIG. 3 is a table illustrating the values of $l_j$_base[l] with w=5 according to the sample set of symbols in FIG. 1 and FIG. 2. In this example, assuming that a sample bit stream is "1010101100 . . . ", then V is the 5-bit codes from the bit stream, i.e., V="10101" or 21 as decimal integer. At Step 2a, the maximum codeword length l is determined to be 3 since $l_j$_base[3]=12≦21. Further, at Step 2b, symbol number $r_i$=offset[3]+(21−$l_j$_base[3])>>(5− 3)=8+2=10. As a result, symbol "rat" corresponding to $r_i$ of 10 is obtained from FIG. 1. Finally, at Step 2d, a next 5-bit code "01011" is extracted from the bit stream as V for Canonical Huffman decoding as previously explained.

FIG. 4 is a block diagram of a decoder for decoding an input bit stream into a plurality of symbols according to one embodiment of the invention. In an embodiment of the invention, the input bit stream is a canonical Huffman encoded bit stream. The decoder 40 comprises a length generator 42, a base selector 44, a processing unit 46, and an extractor 420. The extractor 420 receives the input bit stream 402 and extracts a code 410 with a w-bit codeword length from the input bit stream 402, where w is a positive integer not smaller than the length of a longest codeword of the bit stream, L. The length generator 42 is coupled to the extractor 420 for receiving the extracted code 410 therefrom and determining a first codeword length 404 corresponding to a symbol 406 according to the code 410 and a base table 426. The base selector 44, coupled to the length generator 42, determines a codeword base 408 corresponding to the first codeword length 404 according to the base table 426. The processing unit 46 generates the symbol 406 corresponding to the code 410 according to the codeword base 408, the first codeword length 404 and an offset table 472.

As shown in FIG. 4, the length generator 42 comprises a plurality of comparators 422 and a multiplexer 424. The plurality of comparators 422 compare the code 410 with a plurality of base values 425 of the base table 426 to generate a plurality of comparing results 423. The multiplexer 424 then determines the first codeword length 404 according to the plurality of comparing results 423.

Moreover, the processing unit 46 comprises an offset generator 460, a subtracting and shifting unit 462, an adder 464 and a symbol generator 466. The offset generator 460 provides a codeword offset 412 corresponding to the first codeword length 404 according to the offset table 472. The subtracting and shifting unit 462 obtains a difference value between the codeword base 408 and the code 410 and shifts the difference value to generate a first output 414. According to the step 2b described above, the subtracting and shifting unit 462 right shifts the difference value between the codeword base 408 and the w-bit code 410. The adder 464 then adds the codeword offset 412 obtained from the offset generator 460 and the first output 414 to generate a second output 416. The symbol generator 466 obtains the symbol 406 from a symbol table 468 in accordance with the second output 416.

According to this embodiment, the decoder 40 is provided with a low cost and fast implementation of the above-mentioned fast decoding algorithm. With reference to the above-mentioned fast decoding algorithm and the sample set of symbols of FIG. 1, the decoding process of the decoder 40 is described below in details with reference to FIG. 4.

As mentioned above, it is assumed that the input bit stream 402 contains "1010101100 . . . ", and the code 410 generated from the extractor 420 is "10101" (21 as code value in decimal integer) with w=5 since the length ($l_i$) of a longest codeword equals to 5 as shown in FIG. 1. The code 410 is then output to the plurality of comparators 422. The plurality of comparators 422 compare the code 410 with a plurality of base values 425, such as $l_{j\_}base[2]=24$, $l_{j\_}base[3]=12$, $l_{j\_}base[4]=2$ and $l_{j\_}base[5]=0$, from the base table shown in FIG. 3. Thus, the plurality of comparing results 423 are output to the multiplexer 424 and the base selector 44 to determine the first codeword length 404 and the codeword base 408, respectively. In the illustrated embodiment, the multiplexer 424 determines whether the first codeword length 404 is a maximum codeword length l having a base value smaller than the code 410. As a result, the first codeword length 404 is 3 and the codeword base 408 equals to 12 ($l_{j\_}base[3]$). The equation shown in Step 2b is performed by the offset generator 460, the subtracting and shifting unit 462 and the adder 464, to determine the second output 416, i.e., $r_i$=offset[3]+$(21-l_{j\_}base[3])$>>(5-3)=10. Consequently, the second output 416 which is the symbol number $r_i$ of the symbol 406 is output to the symbol generator 466 for a look-up operation based on the symbol table 468, such as the table of FIG. 1. The symbol 406 of "rat" is thus determined. The decoder 40 according to this embodiment of the invention can be any digital device, such as Real Video encoder/decoder, for decoding the input bit stream to the plurality of symbols and vice versa.

Figure 5:
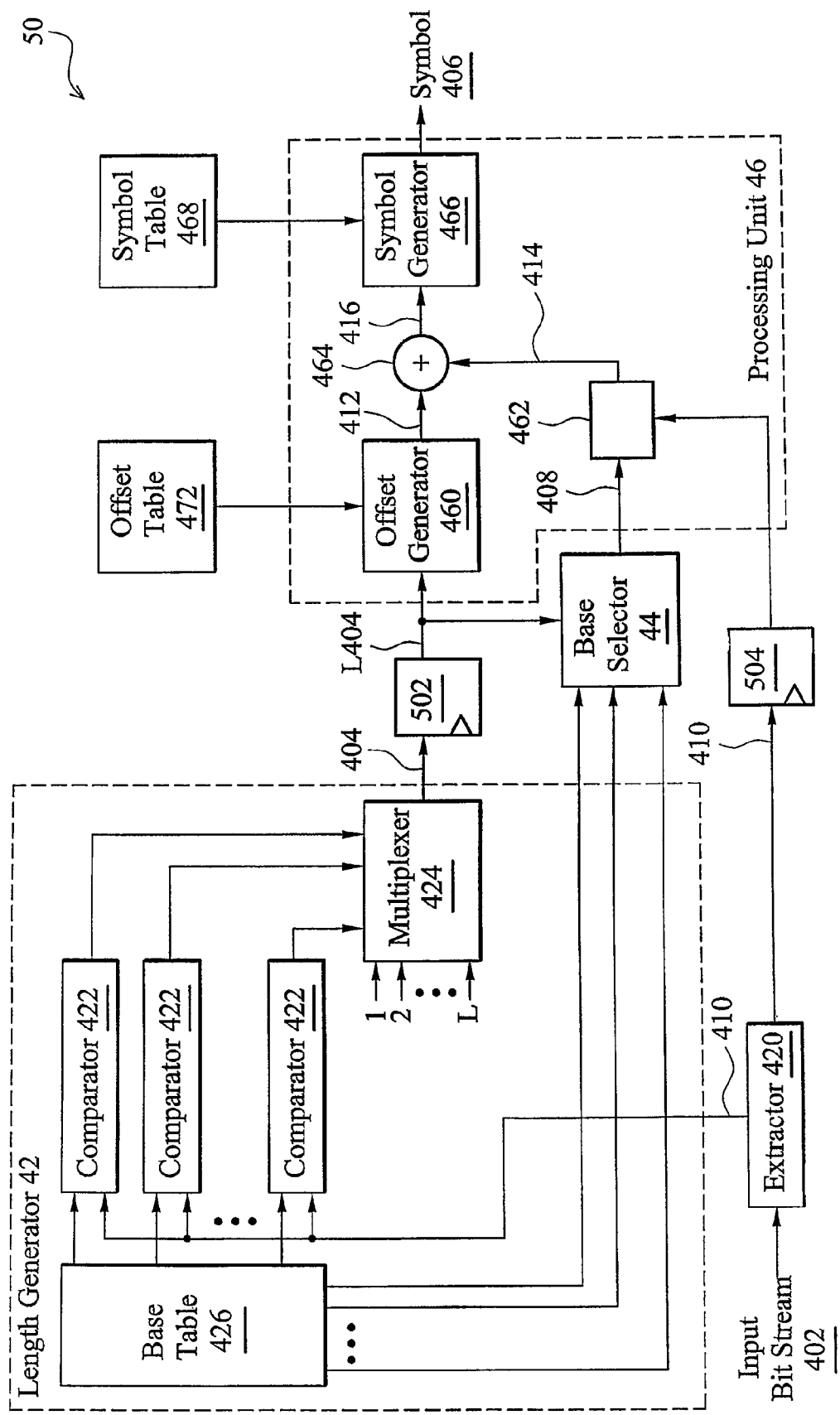
FIG. 5 is a block diagram of a decoder for decoding an input bit stream into a plurality of symbols according to another embodiment of the invention.

FIG. 5 is a block diagram of a decoder for decoding an input bit stream into a plurality of symbols according to another embodiment of the invention. The decoder 50 is similar to the decoder 40 except that the decoder 50 further comprises latch units 502 and 504, such as flip-flops, to provide a pipeline decoding process. As shown in FIG. 5, the latch unit 502 is coupled to the multiplexer 424. In the first phase, the latch unit 502 is operated to latch the first codeword length 404 and generate a delayed first codeword length L404. Similarly, the latch unit 504, coupled to the extractor 420, is operated to latch the extracted code 410 and generate a delayed code. In a second phase, the base selector 44 determines the codeword base 408 corresponding to the delayed first codeword length L404 according to the base table 426. Further, the processing unit 46 generates the symbol 406 corresponding to the delayed first codeword length L404 according to the codeword base 408 and the delayed code. Therefore, when the processing unit 46 generates the symbol 406 in response to the delayed first codeword length L404 and the delayed code in the second phase, the length generator 42 simultaneously generate a next first codeword length in the first phase.

Figure 6:
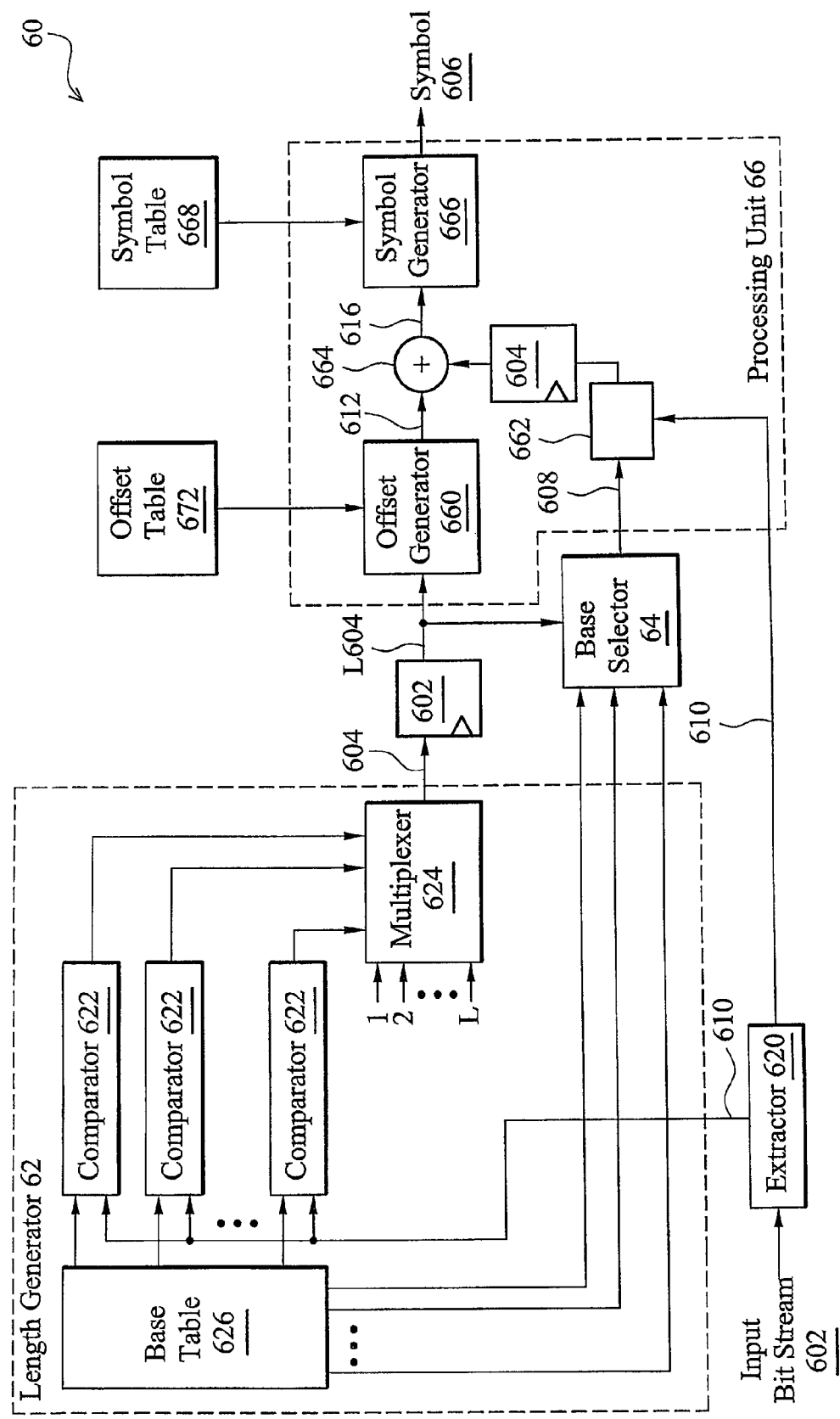
FIG. 6 is a block diagram of a decoder for decoding an input bit stream into a plurality of symbols according to still another embodiment of the invention.

FIG. 6 shows another decoder for decoding an input bit stream into a plurality of symbols in a pipeline decoding operation according to still another embodiment of the invention. Similarly, the decoder 60 comprises latch units 602 and 604 for performing a pipeline decoding operation. In this embodiment, the latch unit 602 is coupled to the multiplexer 624 for delaying a first codeword length 604 from a length generator 62 to generate a delayed first codeword length L604 in a first phase. Also, the latch unit 604 is coupled to a subtracting and shifting unit 662 for generating a delayed first output. In a second phase, an offset generator 660 provides a codeword offset 612 corresponding to the delayed first codeword length L604 according to an offset table 672. Moreover, an adder 664 adds the codeword offset 612 and the delayed first output for generating a second output 616 corresponding to a symbol 606. Accordingly, when the symbol 606 is generated in the second phase, the length generator 62 simultaneously generate a next first codeword length in the first phase. It is noted that decoders shown in FIGS. 5 and 6 for pipeline operations are merely exemplary embodiments, where those skilled in the art may adjust to latch other output in the decoders using the latch unit 504 or 604 with latching the first codeword length in the first phase according to design necessity and components employed thereof with the principles of the invention.

Figure 7:
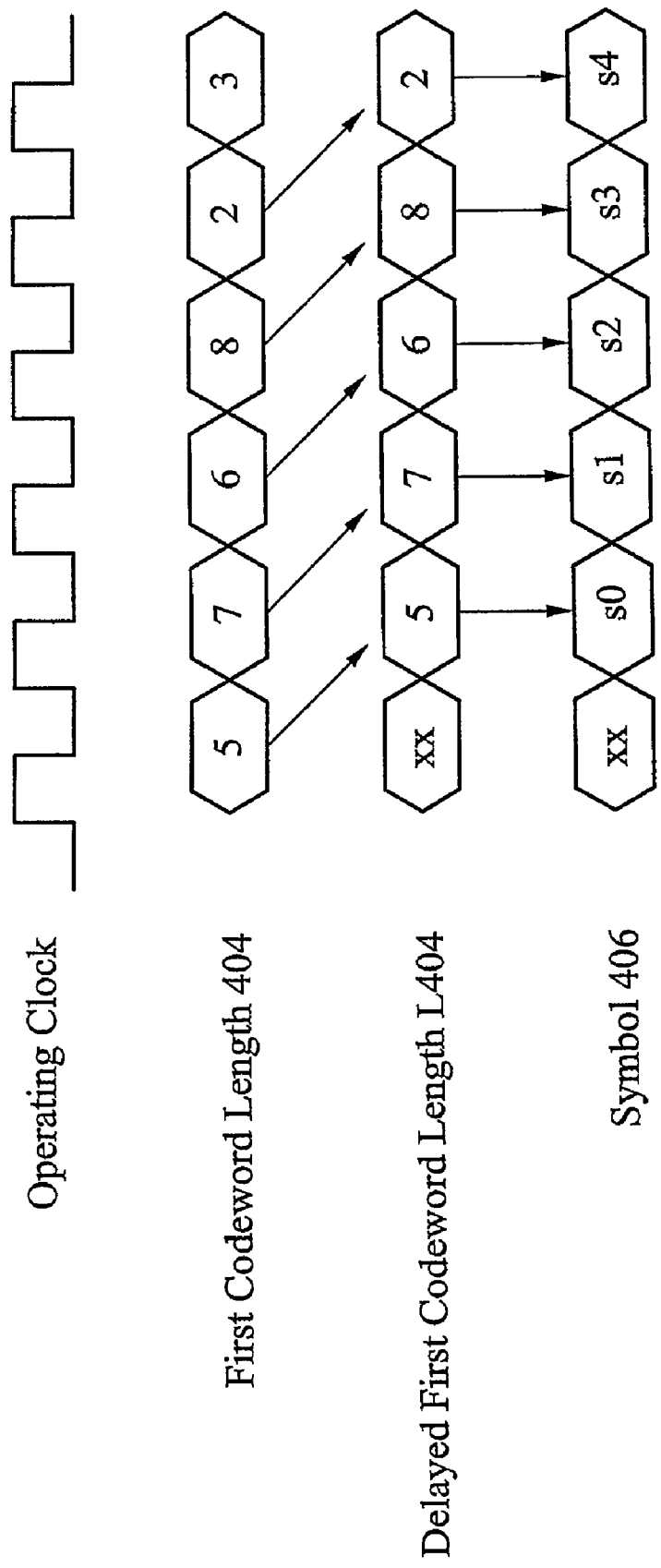
FIG. 7 is a timing diagram illustrates pipeline decoding operation in accordance with the embodiment of FIG. 5 and FIG. 6.

Referring to FIG. 7, a timing diagram illustrates a pipeline decoding operation in accordance with the embodiments of FIG. 5 and FIG. 6. As shown in FIG. 7, a first codeword length 404, such as "5", is generated in a first phase. The latch unit 502 or 602 then generates the delayed first codeword length L404 by latching the first codeword length 404. The delayed first codeword length L404 is provided for deriving a symbol "s0" in a second phase while a next first codeword length, such as "7", is generated in the first phase. Therefore, the decoder operating speed limited by the critical path delays in conventional decoding circuits is reduced to provide high speed performance.

Figure 8:
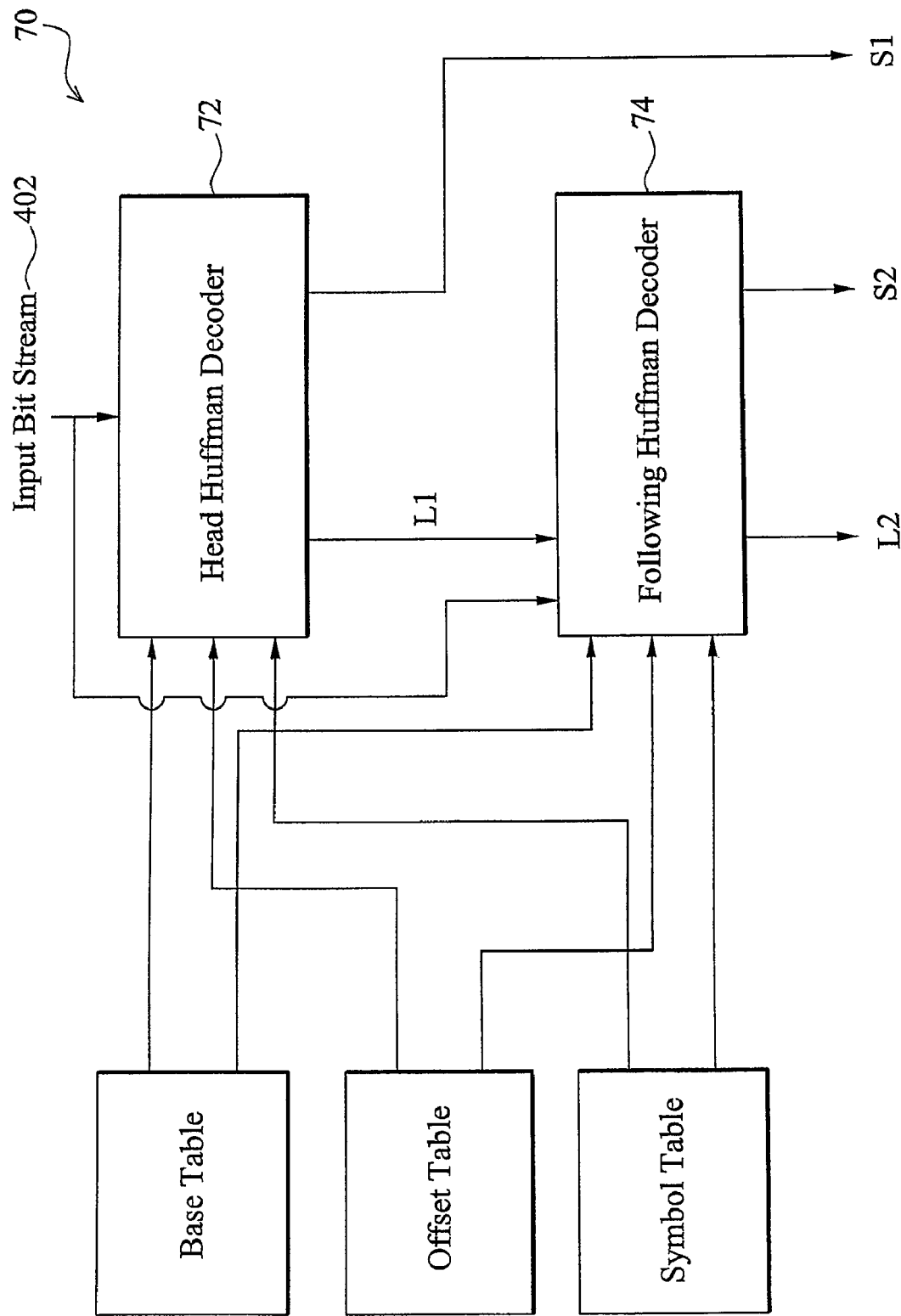
FIG. 8 is block diagram of a decoding apparatus for decoding an input bit stream into a plurality of symbols according to still another embodiment of the invention.

FIG. 8 is block diagram of a decoding apparatus for decoding an input bit stream into a plurality of symbols according to still another embodiment of the invention. In this embodiment, the decoding apparatus 70 comprises a head Huffman decoder 72 and a following Huffman decoder 74. Structures and operations in the head Huffman decoder 72 and the following Huffman decoder 74 are similar to those of FIGS. 4, 5 and 6, and hence, further description thereof is omitted for brevity. As shown in FIG. 8, the decoding apparatus 70 uses cascade-connected decoders to decode a plurality of symbols in one clock cycle. The first codeword length L1 is outputted from the head Huffman decoder 72 to the following Huffman decoder 74, the input bit stream to the following Huffman decoder 74 is left shifted with L1 bits so that extractor may extract a code with a predetermined codeword length accordingly from the updated bit stream. Further, a first symbol S1 and a second symbol S2 are simultaneously decoded from the head Huffman decoder 72 and the following Huffman decoder 74, respectively. Therefore, the two decoders arranged in a cascade manner allow decoding of two symbols per operating clock. Note that more than two decoders may be arranged in cascade to substantially improve high speed throughput performance.

Figure 9:
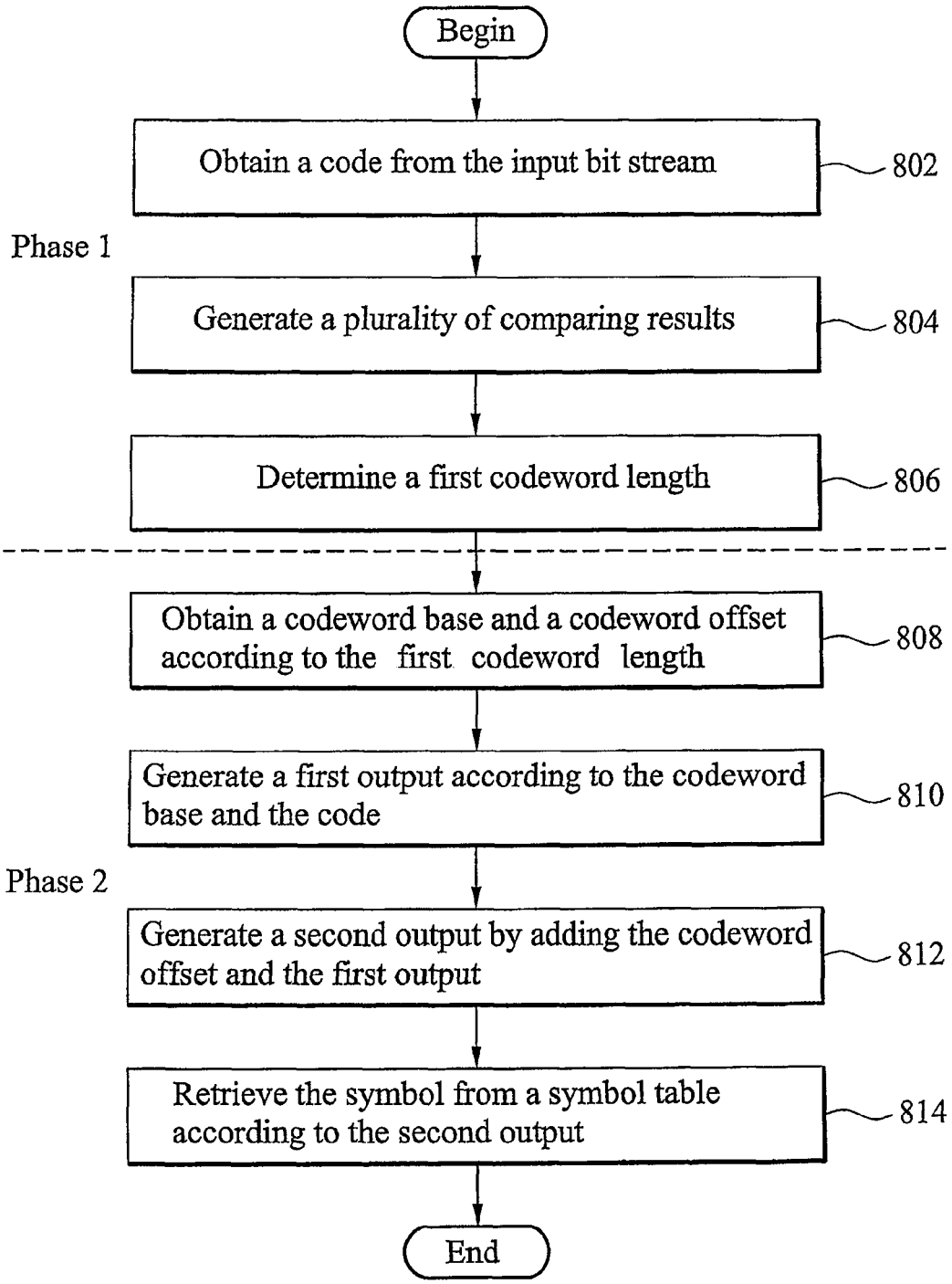
FIG. 9 is an exemplary flow chart of a decoding method for decoding an input bit stream into a plurality of symbols according to still another embodiment of the invention.

FIG. 9 is an exemplary flow chart of a decoding method decoding for an input bit stream into a plurality of symbols according to still another embodiment of the invention. In the embodiment, the decoding method described hereinafter employs two phases to perform a pipeline decoding process, thereby improving decoding efficiency.

Referring to FIG. 5 and FIG. 9, in a first phase, a first-phase decoding unit, such as the length generator 42, is provided for generating a first codeword length according to a code extracted from the input bit stream, where the input bit stream is canonical Huffman encoded bit stream. During the first phase, a code with a predetermined codeword length (such as 5-bit code) is extracted from the input bit stream (step 802). Then, a plurality of comparing results is generated by comparing the code with a plurality of base values from a base table (step 804). As described above, the first codeword length is determined according to the plurality of comparing results (step 806). Note that the first codeword length is determined by finding a maximum codeword length having a corresponding base value smaller than the code.

Further, in a second phase, a second-phase decoding unit, such as the processing unit 46, is provided for generating a symbol corresponding to the extracted code according to the first codeword length from the first phase. Specifically, a codeword base and a codeword offset corresponding to the first codeword length from the first phase are respectively obtained from the base table and an offset table (step 808). Thereafter, a subtracting step is subsequently performed to obtain a difference value between the codeword base and the code. A first output is then obtained by shifting the difference value (step 810). The codeword offset and the first output are summed up to generate a second output (step 812). Finally, the symbol is retrieved from a symbol table in accordance with the second output (step 814).

According to the embodiment, when the symbol corresponding to the first codeword length is generated in the second phase, a next first codeword length is simultaneously generated in the first phase. Moreover, the above-mentioned decoding of FIG. 9 method can be performed in an encoder.

Figure 10:
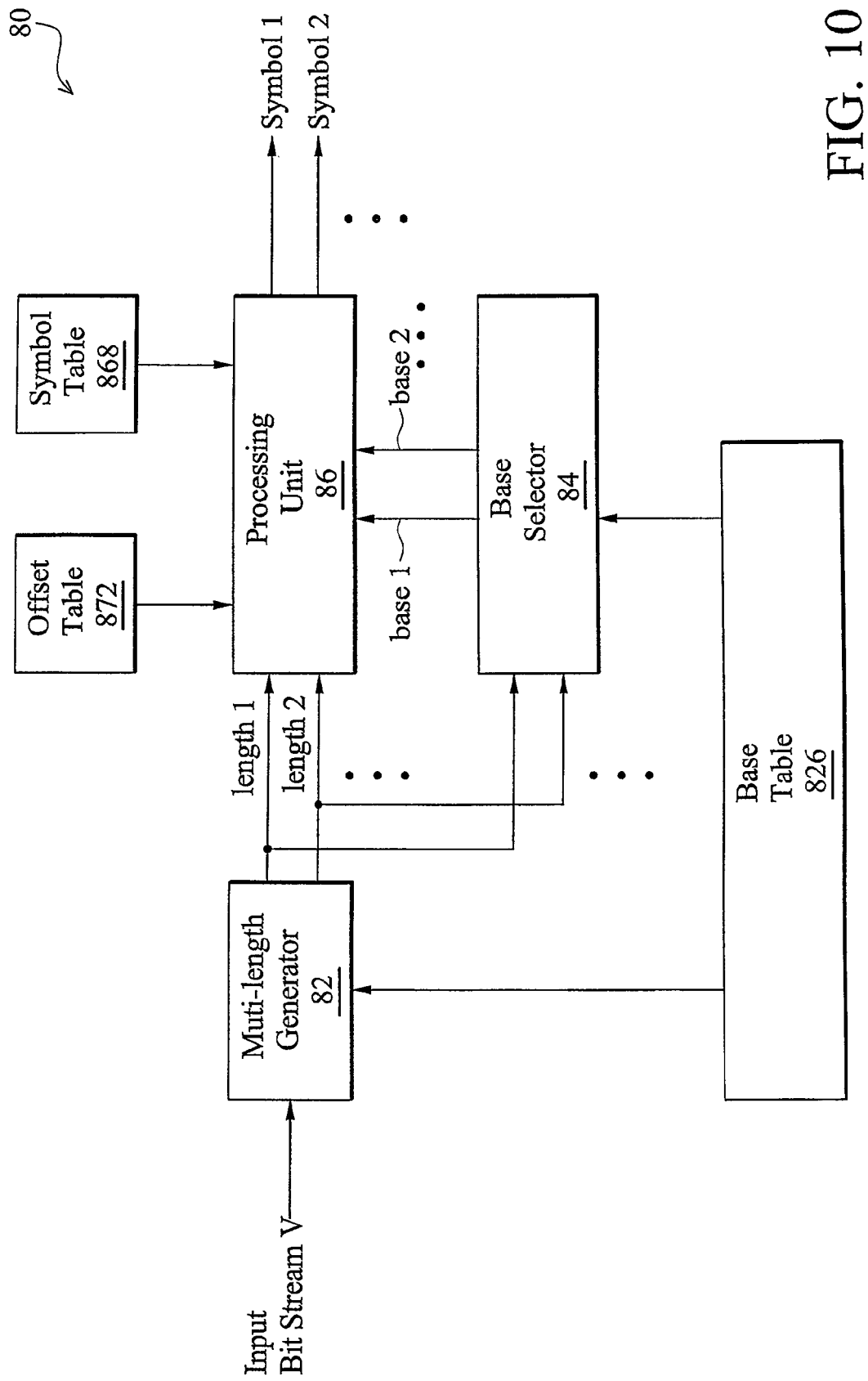
FIG. 10 is a block diagram of a decoder for decoding an input bit stream into a plurality of symbols in parallel according to still another embodiment of the invention.

FIG. 10 is a block diagram of a decoder for decoding an input bit stream into a plurality of symbols in parallel according to still another embodiment of the invention. In the embodiment, the decoder 80 comprises a multi-length generator 82 for generating a plurality of first codeword lengths in parallel, thereby obtaining the plurality of symbols simultaneously. The operations of the decoder 80 and the multi-length generator 82 are described below in details with reference to FIG. 11 and FIG. 12.

Figure 11:
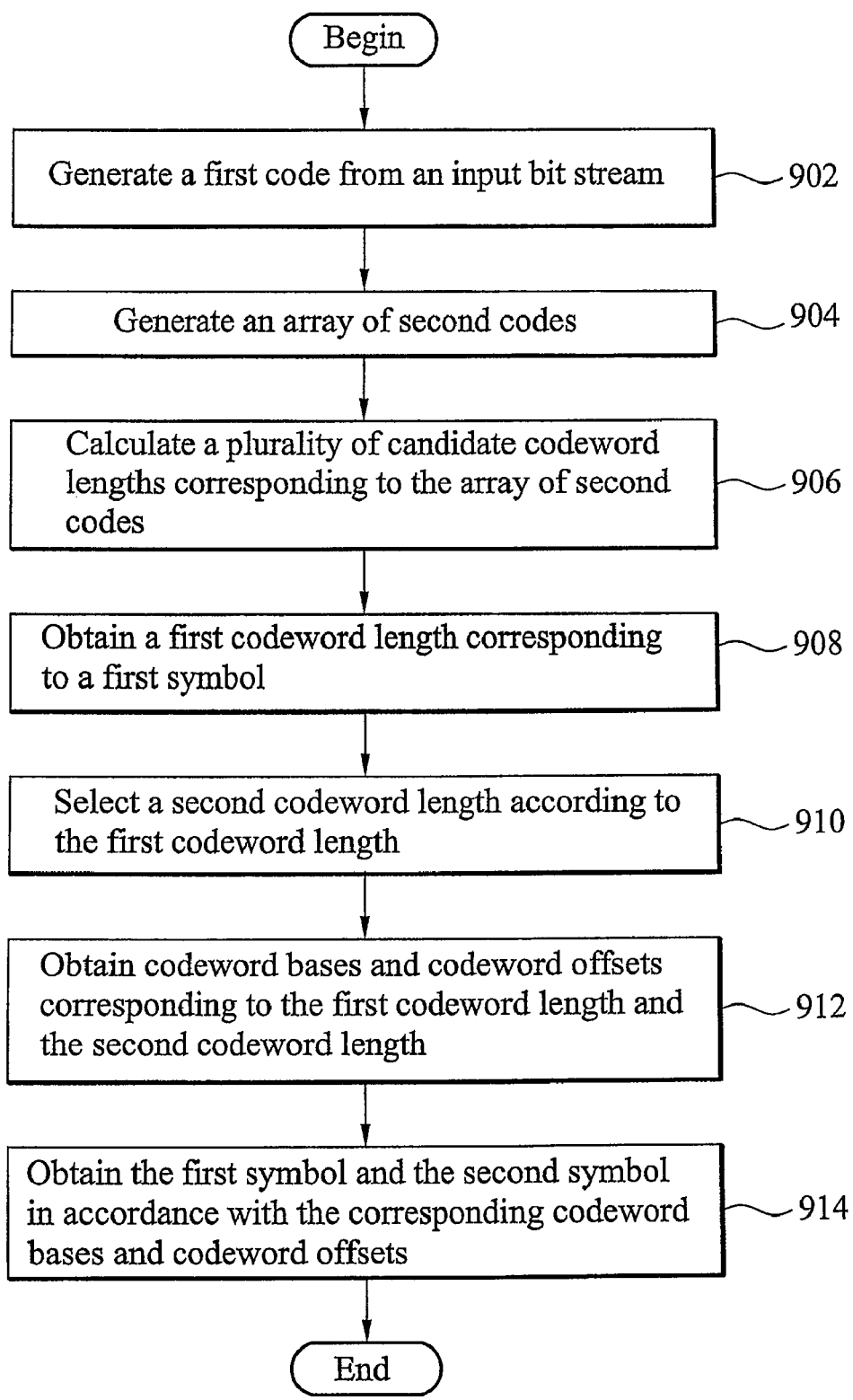
FIG. 11 is an exemplary flow chart of a decoding method for decoding an input bit stream into a plurality of symbols in parallel according to still another embodiment of the invention.
Figure 12:
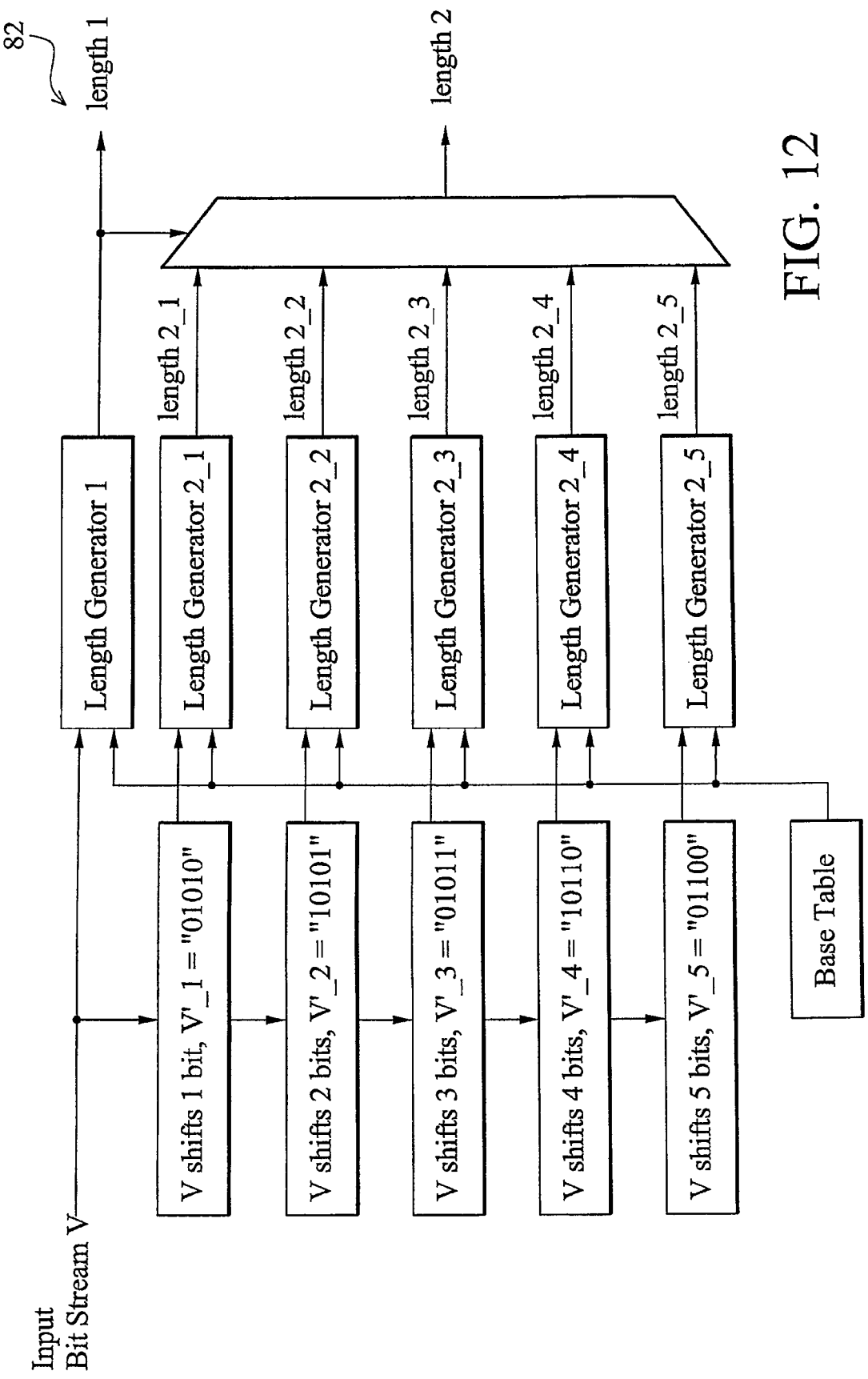
FIG. 12 is an example of the multi-length generator of FIG. 10.

FIG. 11 is an exemplary flow chart of a decoding method for decoding an input bit stream into a plurality of symbols in parallel according to still another embodiment of the invention. FIG. 12 shows an example of the multi-length generator 82 of FIG. 10. The decoding method of FIG. 11 is provided to calculate all possible codeword lengths in advance. Once a first codeword length is determined, a next first codeword length is selected from the plurality of possible codeword lengths which are obtained in parallel, without any further calculation. With this decoding method, the decoding speed and throughput are significantly improved over the prior art.

It is assumed that the multi-length generator 82 generates two first codeword lengths in parallel according to the embodiment. As mentioned above, the process starts with the generation of a first code with a predetermined codeword length from an input bit stream V (step 902), where the predetermined codeword length is greater than or equal to a maximum codeword length of the input bit stream V. Note that in an embodiment of the invention, the input bit stream V is canonical Huffman encoded bit stream. For illustration purpose, it is again assumed that the input bit stream contains bit strings "1010101100 . . . " and the predetermined codeword length is 5. Then, the first extracted code is "10101". Next, the input bit stream is left shifted by a plurality of shift bits to generate a plurality of second codes (step 904). The shift bits are different integers ranging among 1 to the predetermined codeword length. For example, as shown in FIG. 12, the shift bit is incremented from 1 to 5 and the plurality of second codes include V'_1="01010" (shift bit is 1), V'_2="10101" (shift bit is 2), V'_3="01011" (shift bit is 3), V'_4="10110" (shift bit is 4), and V'_5="01100" (shift bit is 5). Next, corresponding to the plurality of second codes, a plurality of candidate codeword lengths are respectively calculated (step 906). Referring to FIG. 12, the plurality of candidate codeword lengths, including length 2_1 to length 2_5, are separately obtained from length generators 2_1 to 2_5, wherein the connection and function of the length generators 2_1 to 2_5 are substantially the same with the length generator 42 of FIG. 4, and thus, detailed descriptions are omitted for brevity.

Next, a first codeword length (length 1 shown in FIG. 12) corresponding to a first symbol is obtained from the length generator 1. It is noted that the length 1 is determined by comparing the first extracted code with a plurality of base values from a base table 826 in FIG. 10 (step 908). Moreover, according to the first codeword length, a second codeword length (length 2 shown in FIG. 12) corresponding to a second symbol is then selected from the plurality of candidate codeword lengths (step 910). As shown in FIG. 12, assuming length 1 is 3; therefore, length 2_3 is selected as the length 2.

Next, as shown in FIG. 10, codeword bases (such as base 1 and base 2) and codeword offsets (not shown) corresponding to the first and second codeword lengths, length 1 and length 2, are provided by a base selector 84 and a processing unit 86 respectively according to the base table 826 and an offset table 872 (step 912). Note that the operations of the processing unit 86 and the base selector 84 are substantially similar to corresponding units of FIG. 4 and FIG. 5, and hence, further description thereof is omitted.

Finally, the first symbol (symbol 1 in FIG. 10) and the second symbol (symbol 2 in FIG. 10) are generated from a symbol table 868 according to the corresponding codeword bases and codeword offsets by the processing unit 86 (step 914).

As described above, the decoding method and apparatus of the invention can decode two or more symbols per clock cycle. Moreover, the critical path delay reduction proposed by decoders of the invention allows decoding the encoded data in real time and achieving a higher overall data throughput rata than prior art.

While the invention has been described by way of example and in terms of preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A decoder for decoding an input bit stream into a plurality of symbols in parallel, comprising:
   a multi-length generator for receiving the input bit stream to generate a first code with a predetermined codeword length, generating an array having a plurality of second codes with the predetermined codeword length, wherein the second codes of the array are obtained by left shifting the input bit stream with respect to each of a plurality of shift bits, and the shift bits are different integers ranging from one to the predetermined codeword length, calculating a plurality of candidate codeword lengths corresponding to the plurality of second codes respectively, determining a first codeword length corresponding to a first symbol, and selecting a second codeword length corresponding to a second symbol from the plurality of candidate codeword lengths according to the first codeword length; and
   a processing unit obtaining the first and second symbols corresponding to the first and second codeword lengths respectively.

2. The decoder as claimed in claim 1, wherein the multi-length generator compares the first code with a plurality of base values from a base table to determine the first codeword length.

3. The decoder as claimed in claim 2, wherein the processing unit obtains codeword bases and codeword offsets corresponding to the first codeword length and the second codeword length from the base table and an offset table respectively, and obtains the first symbol and the second symbol from a symbol table in accordance with the codeword bases and codeword offsets.

4. The decoder as claimed in claim 2, wherein the multi-length generator calculates the plurality of candidate codeword lengths by comparing each of the second codes with the plurality of base values and determining a corresponding candidate codeword length for each second code according to whether the corresponding candidate codeword length is a maximum codeword length having a base value smaller than the corresponding second code.

* * * * *